United States Patent
Watkins et al.

(10) Patent No.: US 7,391,213 B2
(45) Date of Patent: Jun. 24, 2008

(54) THREE AXIS ANGLE INVARIANT RF COIL ASSEMBLY AND METHOD AND SYSTEM EMPLOYING SAME

(75) Inventors: Ronald Watkins, Niskayuna, NY (US); Charles Dumoulin, Ballston Lake, NY (US); Randy Giaquinto, Burnt Hills, NY (US)

(73) Assignee: General Electric Company, Niskayuna, NY (US)

( * ) Notice: Subject to any disclaimer, the term of this patent is extended or adjusted under 35 U.S.C. 154(b) by 1129 days.

(21) Appl. No.: 10/428,433

(22) Filed: May 2, 2003

(65) Prior Publication Data

US 2004/0220468 A1     Nov. 4, 2004

(51) Int. Cl.
    *G01V 3/00*     (2006.01)
    *A61B 5/055*     (2006.01)

(52) U.S. Cl. ............... 324/318; 324/309; 324/307; 600/422; 600/410

(58) Field of Classification Search ......... 324/318–322, 324/309, 307; 600/410, 422
See application file for complete search history.

(56) References Cited

U.S. PATENT DOCUMENTS

| | | | |
|---|---|---|---|
| 4,887,039 A | | 12/1989 | Roemer et al. |
| 5,483,159 A | * | 1/1996 | Van Heelsbergen ......... 324/318 |
| 5,594,337 A | * | 1/1997 | Boskamp ................... 324/318 |
| 6,249,121 B1 | | 6/2001 | Boskamp et al. |
| 6,420,871 B1 | | 7/2002 | Wong et al. |
| 2004/0220468 A1 | * | 11/2004 | Watkins et al. ............... 600/410 |

OTHER PUBLICATIONS

C.E. Hayse, W.A. Edelstein, J.F. Schenck, O.M. Mueller, M. Eash; "An Efficient, Highly Homogenous Radiofrequency Coil for Whole Body NMR Imaging @1.5 T"; Journal of Magnetic Resonance, 63:622-628, 1985.( 8 Pages).

C. L. Dumoulin, S. P. Souza, R. D. Darrow; "Real-Time Position Monitoring of Invasive Magnetic Resonance"; Magn. Reson. Med., 29:411-415, 1993.

Harald H. Quick, Mark E. Ladd, Daniel Nanz, Krzysztof P. Mikolajczyk, and Jorg F. Debatin; "Vascular Stents as RF Antennas for Intravascular MR Guidance and Imaging"; Magnetic Resonance in Medicine 42:738-745 (1999).

* cited by examiner

*Primary Examiner*—Brij Shrivastav
*Assistant Examiner*—Tiffany A Fetzner
(74) *Attorney, Agent, or Firm*—Fletcher Yoder

(57) ABSTRACT

A radio frequency coil assembly for use in a magnetic resonance system comprises a set of conductors for detecting magnetic resonance signals in three orthogonal planes and capacitors for resonating the set of conductors at a predetermined frequency. A conductor of the set of conductors is placed on each edge of a cube-shaped volume and the capacitors are placed on each conductor of the set of conductors such that each conductor has substantially equal effective capacitance.

A four element band pass birdcage coil comprises two square end ring segments, each end ring segment comprising four sides of equal length, and four rungs of length equal to a side of the end ring segment, and wherein four rungs join in respective corners of the end ring segments.

31 Claims, 4 Drawing Sheets

THREE AXIS ANGLE INVARIANT RF COIL ASSEMBLY AND METHOD AND SYSTEM EMPLOYING SAME

BACKGROUND OF THE INVENTION

The invention relates generally to Magnetic Resonance Imaging (MRI) or Spectroscopy systems and more specifically to a radio frequency (RF) coil assembly for use in such systems, the coil assembly being invariant in its performance with respect to the angle and orientation of a main magnetic field of these systems.

Magnetic Resonance Imaging (MRI) is a non-invasive imaging technique, in which the imaged subject is kept in a static main magnetic field, known as the B0 field and the nuclei of the imaged subject are excited by the radio-frequency (RF) magnetic field known as the B1 field. Magnetic Resonance Spectroscopy is a similar technique used to identify chemical makeup of a subject. For certain MRI and Spectroscopy systems, a plurality of radio frequency coils are needed to transmit the RF energy to the nuclear magnetic moments as well as to receive the extremely small signal that comes back from the subject. The signals, referred to as magnetic resonance signals, result from reorientation of certain gyromagnetic materials of the subject, whose molecules spin or precess at characteristic frequencies. The radio frequency coils are commonly employed to image whole body, head and limb imaging in medical applications. Such techniques are also used outside of the medical imaging field, such as in part inspection, baggage inspection, and so forth.

Various coil geometries and coil arrangements are used to enhance the ability to transmit to or receive signals from the imaged or analyzed subject. Quadrature arrangements used in MRI generate two B1 fields at right angles to each other with a 90° phase shift between the two. This generates a transmitter field with a defined direction of rotation. Provided this rotation corresponds with the sense of the spin's precession, the coil excites the spins with twice the efficiency of a non-quadrature (linear) coil. During a receive phase, two independent phase-shifted signals are obtained which, following additional electronic phase shifting, can be combined to produce a signal with an improved signal-to-noise ratio (SNR). A quadrature coil is typically constructed using two independent coils wound at right angles to each other.

One variation in the quadrature arrangement is a birdcage coil. The birdcage coil is a single structure which can be driven independently at two positions 90° apart. The birdcage coil behaves like a tuned transmission line with one complete cycle of standing wave around the circumference. One advantage of this arrangement is that it is simple to produce an exceedingly uniform B1 radio frequency field over most of the coil's volume, providing images with a high degree of uniformity. A second advantage is that nodes with zero voltage occur 90° away from the driven part of the coil, thus facilitating the introduction of a second signal in quadrature which produces a circularly polarized radio frequency field. Birdcage coils usually employ between 8 and 16 elements, aligned along the direction of the static B0 field, connected between annular rings. Capacitors are placed either in each strut or between each strut in the end rings, thus forming low-pass or high pass birdcage coils.

One common limitation which exists while using these coils is that the B1 sensitive axis of the coil is generally kept in an orientation perpendicular to B0 magnetic field for maximum sensitivity and SNR. In quadrature arrangements, another limitation is that the rotation axis of the coil must match the polarization direction of the B0 field. This limitation becomes even more acute where the coil is incorporated into devices that can be moved within the magnet, for example in a catheter which uses a solenoid coil. If the axis of the solenoid coil is parallel to B0, it will detect MR signals poorly. A plurality of coils are conventionally used to overcome this limitation to achieve an insensitive orientation, but as a consequence each coil has a different spatial sensitivity. Thus the spatial location within the device having optimal signal intensity will vary as the device orientation changes.

It would therefore be desirable to have a coil structure which is symmetrical and sensitive in three orthogonal planes, and is invariant with respect to the angle and orientation of a main magnetic field of the MR system.

BRIEF DESCRIPTION OF THE INVENTION

Briefly, in accordance with one embodiment of the invention, a radio frequency coil assembly for use in a magnetic resonance system comprises a set of conductors for detecting magnetic resonance signals in three orthogonal planes, where a conductor of the set of conductors is placed on each edge of a cube-shaped volume. The radio frequency coil assembly further comprises capacitors for resonating the set of conductors at a predetermined frequency. The capacitors are placed on each conductor of the set of conductors such that each conductor has substantially equal effective capacitance.

In accordance with a technique of the invention, a method for generating magnetic resonance data in presence of a gradient field system comprises detecting magnetic resonance signals by a radio frequency coil assembly. The radio frequency coil assembly includes a set of conductors for detecting the magnetic resonance signals in three orthogonal planes, where a conductor of the set of conductors is placed on each edge of a cube-shaped volume. The method further comprises receiving magnetic resonance signals through coaxial cables coupled to mutually orthogonal conductors of the set of conductors, and processing the magnetic resonance signals to obtain magnetic resonance data.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF SPECIFIC EMBODIMENTS

Figure 1:
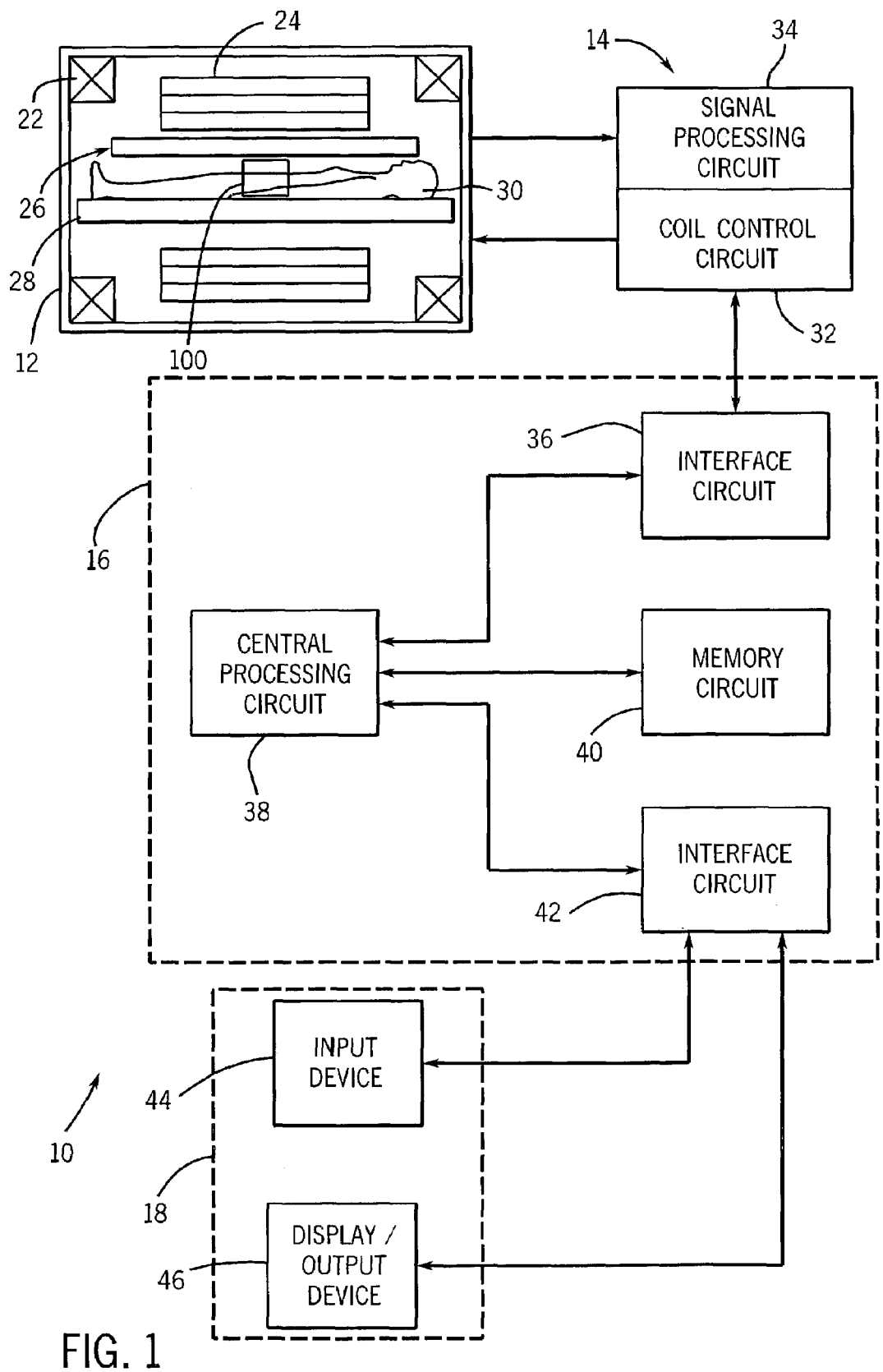
FIG. 1 is a schematic block diagram of an exemplary MR system suitable for use with the present techniques.

Referring now to FIG. 1, a magnetic resonance system, designated generally by the reference numeral 10, is illustrated as including a magnet assembly 12, control and acquisition circuit 14, system controller circuit 16, and an operator interface station 18. The magnet assembly 12, in turn, includes coil assemblies for selectively generating controlled magnetic fields used to excite gyromagnetic materials spin systems in a subject of interest. In particular, the magnet assembly 12 includes a primary coil 22, which will typically include a super conducting magnet coupled to a cryogenic refrigeration system (not shown). The primary coil 22 generates a highly uniform B0 magnetic field along a longitudinal axis of the magnet assembly. A gradient coil assembly 24 consisting of a series of gradient coils is also provided for generating controllable gradient magnetic fields having desired orientations with respect to the subject of interest. In particular, as will be appreciated by those skilled in the art, the gradient coil assembly produces fields in response to pulsed signals for selecting an image slice, orienting the image slice, and encoding excited gyromagnetic material spin systems within the slice to produce the desired image. In Spectroscopy systems these gradient fields may be used differently. An RF transmit coil 26 is provided for generating excitation signals that result in MR emissions from the subject that are influenced by the gradient fields, and collected for analysis as described below.

A table 28 is positioned within the magnet assembly 12 to support a subject 30. While a full body MRI system is illustrated in the exemplary embodiment of FIG. 1, the technique described below may be equally well applied to various alternative configurations of systems and scanners, including smaller scanners and probes used in MR applications.

In the embodiment illustrated in FIG. 1, the control and acquisition circuit 14 includes coil control circuit 32 and signal processing circuit 34. The coil control circuit 32 receives pulse sequence descriptions from the system controller 16, notably through the interface circuit 36 included in the system controller 16. As will be appreciated by those skilled in the art, such pulse sequence descriptions generally include digitized data defining pulses for exciting the coils of the gradient coil assembly 24 during excitation and data acquisition phases of operation. Fields generated by the transmit coil assembly 26 excite the spin system within the subject 30 to cause emissions from the material. Such emissions are detected by a receiving coil assembly 100 and are filtered, amplified, and transmitted to signal processing circuit 34. Signal processing circuit 34 may perform preliminary processing of the detected signals, such as amplification of the signals. Following such processing, the amplified signals are transmitted to the interface circuit 36 for further processing. In the present technique the receiving coil assembly 100 is a spatially invariant system by virtue of its unique configuration, described below. It should be noted that the receive coil assembly 100 may also be used, where desired, in a transmit mode to create the resulting MR signals, thereby replacing, at least in certain applications, the need for a separate transmit coil assembly.

In addition to the interface circuit 36, the system controller 16 includes central processing circuit 38, memory circuit 40, and interface circuit 42 for communicating with the operator interface station 18. In general, the central processing circuit 38, which will typically include a digital signal processor, a CPU or the like, as well as associated signal processing circuit, commands excitation and data acquisition pulse sequences for the magnet assembly 12 and the control and acquisition circuit 14 through the intermediary of the interface circuit 36. The central processing circuit 38 also processes image data received via the interface circuit 36, to perform 2D Fourier transforms to convert the acquired data from the time domain to the frequency domain, and to reconstruct the data into a meaningful image. The memory circuit 40 serves to save such data, as well as pulse sequence descriptions, configuration parameters, and so forth. The interface circuit 42 permits the system controller 16 to receive and transmit configuration parameters, image protocol and command instructions, and so forth.

The operator interface station 18 includes one or more input devices 44, along with one or more display or output devices 46. In a typical application, the input device 44 will include a conventional operator keyboard, or other operator input devices for selecting image types, image slice orientations, configuration parameters, and so forth. The display/output device 46 will typically include a computer monitor for displaying the operator selections, as well as for viewing scanned and reconstructed images. Such devices may also include printers or other peripherals for reproducing hard copies of the reconstructed images.

Figure 2:
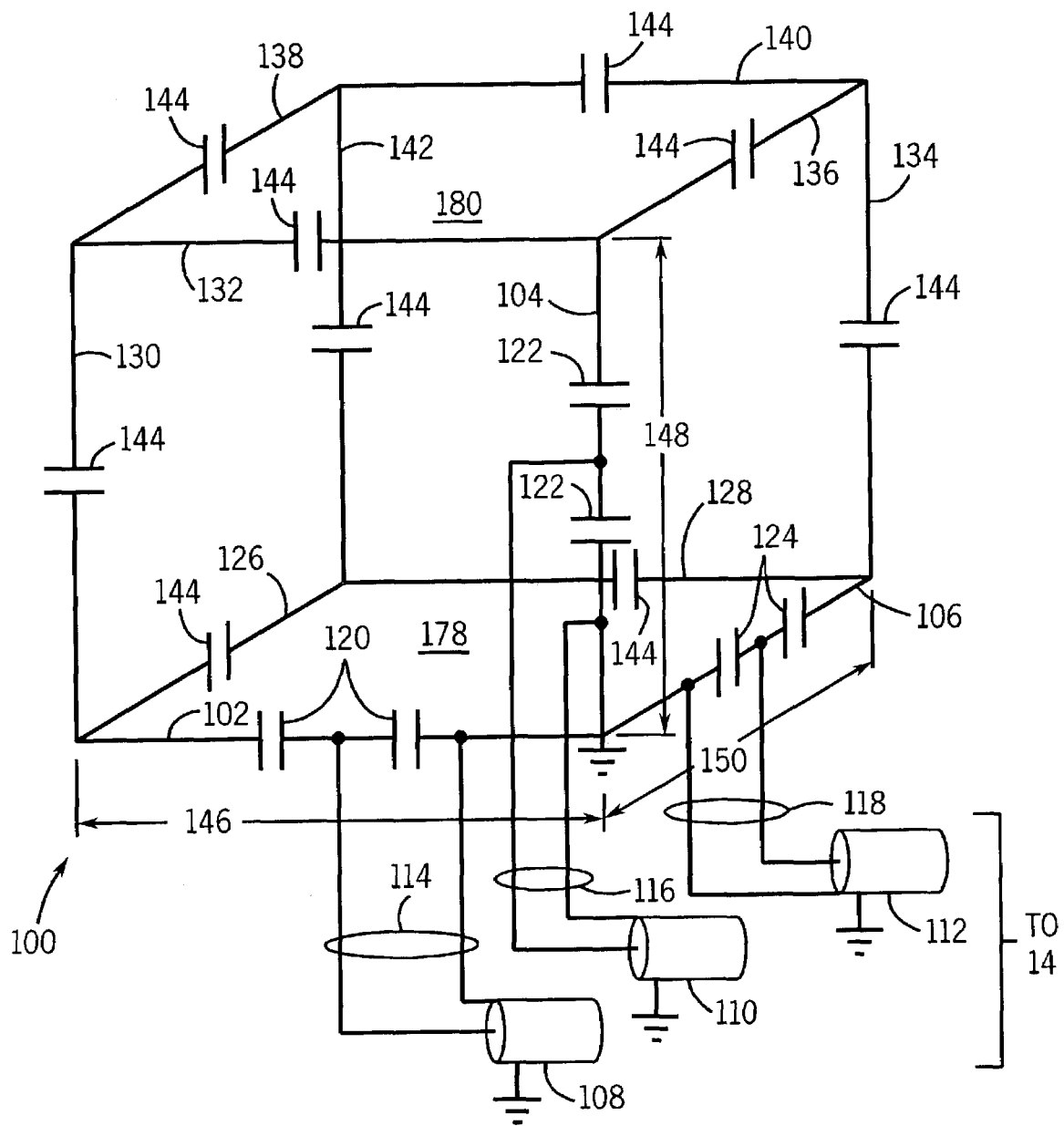
FIG. 2 is a schematic of a radio frequency coil assembly in accordance with one embodiment of the technique for use in MR system of FIG. 1.

FIG. 2 depicts a schematic of radio frequency coil assembly 100 for use in a magnetic resonance system 10 including MRI or spectroscopy systems or other MR applications. The radio frequency coil assembly 100 comprises a set of conductors shown by reference numerals 102-106, 126-142 for detecting magnetic resonance signals in three orthogonal planes. The set of conductors 102-106, 126-142 are configured such that each conductor indicated by the reference numerals, 102; 104; 106; 126; 128; 130; 132; 134; 136; 138; 140; and 142 of the set of conductors 102-106, 126-142 is placed on each edge of a cube-shaped volume.

The radio frequency coil assembly 100 also comprises capacitors 120-124 and 144 for resonating the set of conductors 102-106, 126-142 at a predetermined frequency which is the frequency of magnet assembly 12. The capacitors 120-124 and 144 are placed on each conductor. Referring to FIG. 2, each of the conductors designated by reference numerals 126; 128; 130; 132; 134; 136; 138; 140; and 142, is coupled to a capacitor 144 and conductors 102, 104 and 106 are coupled to capacitors 120, 122 and 124 respectively. In this arrangement, each conductor has substantially equal effective capacitance. The capacitors are also configured to maintain the same effective length of each of the conductors.

FIG. 2 also depicts coaxial cables 108, 110 and 112 coupled to mutually orthogonal conductors 102; 104; and 106 respectively through respective feed lines 114, 116 and 118, for receiving magnetic resonance signals detected by the radio frequency coil assembly 100. These mutually orthogonal conductors 102; 104; and 106, coupled to the coaxial cables 108-112 comprise a plurality of capacitors designated by reference numerals 120, 122 and 124, such that effective capacitance in these conductors 102-106 is equal to capacitance in other conductors 126; 128; 130; 132; 134; 136; 138; 140; 142 of the coil assembly. The coaxial cables 108-112 are grounded as shown in FIG. 2 so that the shields are at same potential, obviating a need for baluns on each feed line. The common point where the mutually orthogonal conductors 102; 104 106 meet is also maintained at ground potential.

The conductor and capacitor arrangement as described hereinabove, facilitates the tuning and matching of the coil so that the coil has a desired center frequency and impedance. As is well known in the art, variations in the size and tissue composition of the anatomy placed in the coil assembly 100 affect the amount of radio frequency energy getting into and the amount of signal detected from the imaged anatomy. For these reasons the radio frequency coil assembly 100 should be tuned whenever it is known that the composition of the anatomy or material in the coil assembly 100 changes. Tuning the coil 100 entails adjusting two types of capacitors on the coil assembly 100. One capacitor is called the matching capacitor and the other the tuning capacitor. The matching capacitor matches the impedance of the coil assembly 100 with imaged subject 30 to that of the 50 Ohm coaxial cable coming from the magnet assembly 12. The tuning capacitor adjusts the resonance frequency of the radio frequency coil assembly 100.

In an exemplary implementation, a coil assembly of the type shown in FIG. 2 was constructed using three axis symmetry. Conductors were placed on each edge of a cube-structure using 6 inch length of copper tubing. In each conductor, capacitor(s) having an effective value of about 56 pf (pico Farads) were placed such that a resonant was formed with a uniform mode at about 64 MHz (Mega Hertz). Feed lines were attached on three orthogonal conductors and the cables were routed to a common corner point. Active blocking circuits were used on each of the three feed points, and additional passive blocking circuits were used to break resonant modes during transmit. The coil was tuned and matched so that each of the three axis' were at the required center frequency and impedance.

As will be appreciated by those skilled in the art, the coil assembly 100 effectively forms a specific type of a birdcage coil in which conductors define end rings and rungs, depending upon the orientation of the assembly with respect to the B0 field. For example, FIG. 2 also depicts a four element band pass birdcage coil 100. The coil 100 comprises two square end ring segments 178 and 180, each end ring segment comprising four sides of equal effective length, and four rungs of length effectively equal to a side of the end ring segment. Referring to FIG. 2, and end ring segment 178, the sides 102, 106, 128 and 126 are of equal effective length i.e. 146 and 150 are effectively equal. Also the rungs 104, 130, 134, and 142 have equal effective length, that is same as the length of side 102 of end ring segment 178. In other words, 148 is effectively equal to 146 and 150. The four rungs 104, 130, 134, 142 join in respective corners of the end ring segments 178 and 180. The birdcage coil 100 further comprises capacitors 144, 120-124 in each side of the end ring segments 178 and 180 and each rung 104, 130, 134, 142 to provide substantially equal effective capacitance in the end ring segments 178 and 180 and rungs 104, 130, 134, 142.

FIG. 2 also depicts that at least two coaxial cables 108 and 112 are coupled to two respective sides 102 and 106 of at least one of the two square end ring segments 178 and at least one coaxial cable 110 is coupled to at least one of the four rungs 104. The respective sides 102 and 106 of the end ring segments 178 and the at least one of the four rungs 104 coupled to the coaxial cables 108-112 comprises a plurality of capacitors 120-124 of effective capacitance equal to capacitance in other sides of the end ring segments 178, 180 and other rungs 130, 134, 142. The functioning of capacitors 144, 120-124 is similar to the description hereinabove with reference to capacitors 144, 120-124 with respect to coil assembly 100.

Figure 3:
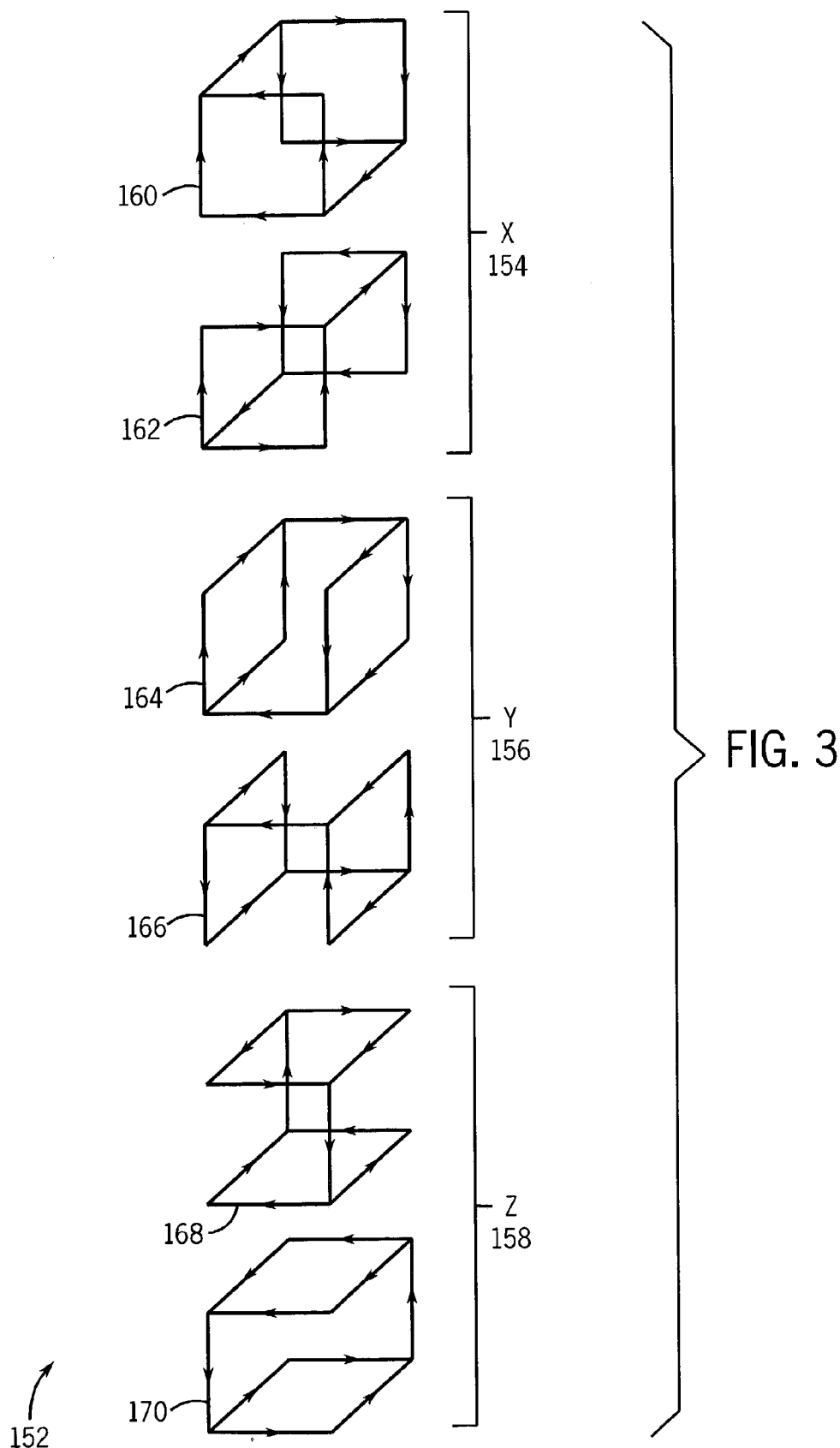
FIG. 3 is a series of schematic diagrams showing the current patterns in the arrangement of FIG. 2 when placed in service.

In the configurations of the coil assembly described hereinabove, when placed in service, the current flows in all the three orthogonal planes X, Y and Z as shown in FIG. 3. Referring to FIG. 3, 152 depicts a series of current patterns in X, Y and Z directions. 154 depicts the X direction current pattern with a X-sine component 160 and a X-cosine component 162. Similarly, 156 depicts the Y direction current pattern with a Y-sine component 164 and a Y-cosine component 166. Also similarly, 158 depicts the current pattern in Z direction, 168 being the Z-sine current component and 170 being the Z-cosine current pattern. As will be appreciated by those skilled in the art, in any orientation of the receive coil assembly 100 and at any given instant of time, two orthogonal components of current flow will exist in the set of conductors of the coil assembly 100 due to transverse spin magnetization.

Figure 4:
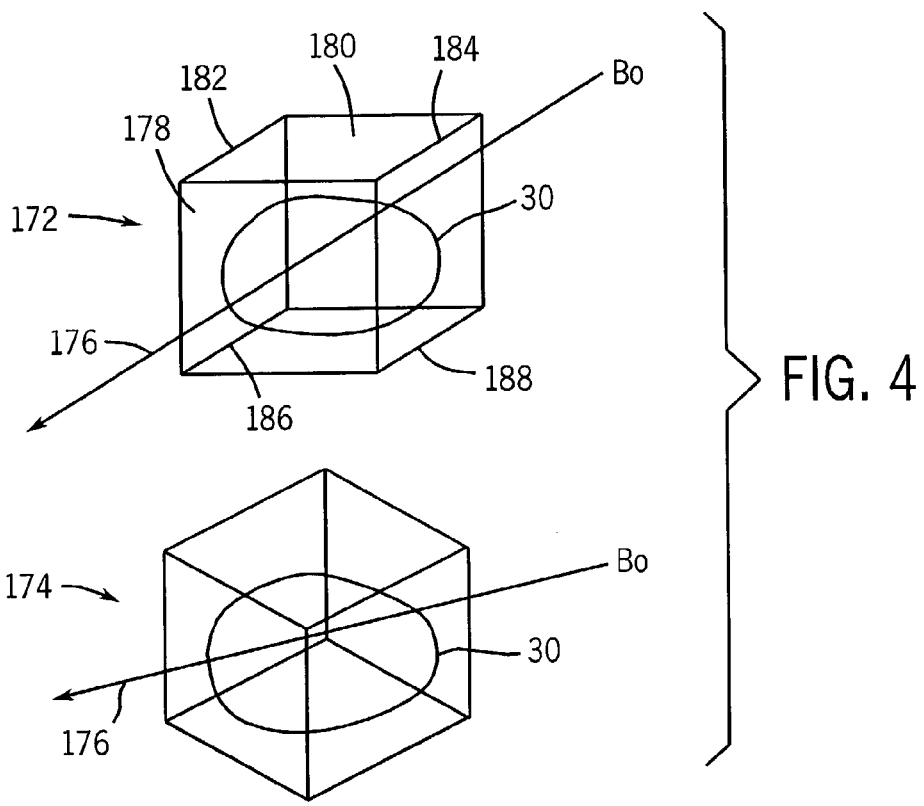
FIG. 4 is a set of diagrams illustrating exemplary placement of the coil assembly of FIG. 2, with respect to a primary or B0 field with spatially invariant effects.

Thus this technique enables the coil assembly 100 to be spatially invariant (with respect to angle relative to B0 and with respect to polarization direction of B0). In other words, the coil assembly 100 is sensitive to magnetic resonance signals in a plurality of orientations with respect to a main magnetic field B0 of the magnetic resonance system 10 as is shown by the series of diagrams in FIG. 4. 178 and 180 depict the square end rings of a birdcage coil described hereinabove and 182, 184, 186 and 188 depict the four rungs. 172 depicts an exemplary orientation, where the subject 30 to be imaged is placed inside the volume of a coil 100 such that the Z axis is parallel to the main magnetic field B0 which has a direction as depicted generally by reference numeral 176. As will be appreciated by one skilled in the art, the signals in this orientation, will be detected in the X and Y directions. 174 depicts another exemplary orientation, where the coil is displaced angularly with respect to B0 depicted by reference numeral 176, and in this orientation as well there will be orthogonal current components in X, Y and Z directions and the coil will be able to detect the signals emanating from imaged subject 30.

MR signals in each of the orthogonal planes are detected using three independent amplifier/receiver channels (not shown) coupled to the coaxial cables 108-110. The detected MR signals are digitized, Fourier Transformed to provide a one, two or three dimensional MR data. The magnitude of MR data from each plane is computed and all three magnitude data sets are combined to provide an MR data set (image) that is insensitive to the orientation of the coil assembly 100.

Figure 5:
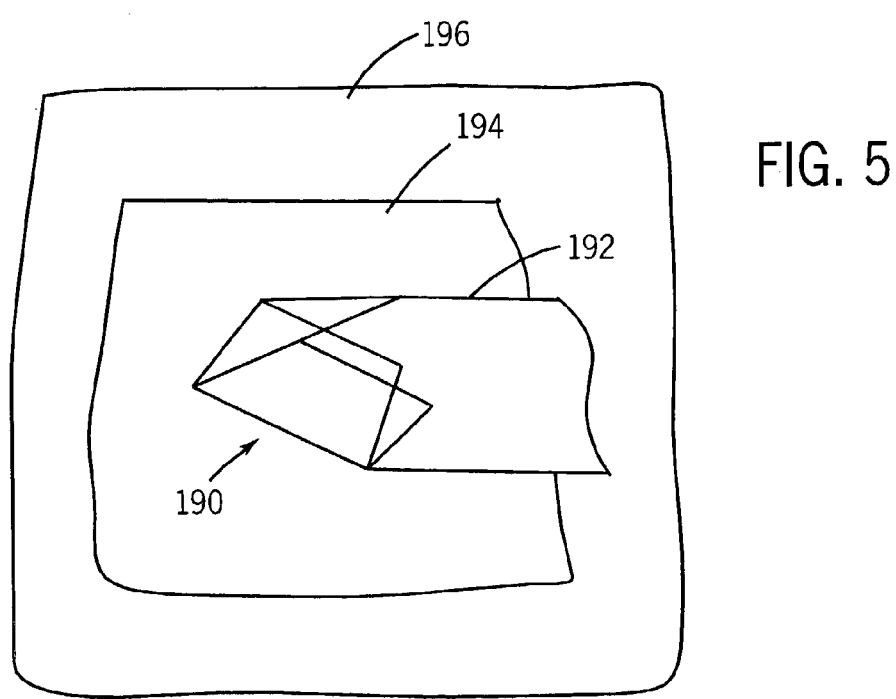
FIG. 5 is a diagrammatic representation of a variant of the coil assembly of FIG. 2, for detecting MR signals emanating from outside the assembly, as in a probe application.

In one specific technique, the coil assembly 100 described hereinabove, is configured to detect radio frequency signals emanating within the cube-shaped volume. Such configurations may be used for imaging and analysis applications where a subject or a portion of a subject may be inserted into the volume defined by the coil assembly. In yet another specific embodiment the set of conductors 102-106, 126-142 are configured to enclose a sphere-shaped or spheroid volume, by configuring the conductors in an arcuate shape. In yet another specific embodiment as shown in FIG. 5, the coil assembly 100 is configured to detect radio frequency signals emanating outside the coil volume. Such configurations may be used for applications such as probes where signals of interest originate from around the defined volume (such as from surrounding tissue). Referring to FIG. 5, 190 depicts the coil configured as a tip of a probe 192 which is passed through a part of human anatomy 196 (e.g. a portion of leg) to sense the MR signals from a blood vessel 194 inside the anatomy 196.

Another aspect of the invention is a method for generating or acquiring magnetic resonance data in presence of a gradient field system. This method comprises detecting magnetic resonance signals by a radio frequency coil assembly 100, the radio frequency coil assembly 100 including a set of conductors 102-106, 126-142 for detecting the magnetic resonance signals in three orthogonal planes, wherein a conductor of the set of conductors is placed on each edge of a cube-shaped volume. The radio frequency coil assembly 100 used in the method described hereinabove comprises same elements as discussed with reference to FIG. 2. The method includes receiving these signals through coaxial cables 108-112 coupled to mutually orthogonal conductors 102; 104 106 of the set of conductors. The method further includes processing the magnetic resonance signals to obtain magnetic resonance data.

Detecting of magnetic resonance signals by a radio frequency coil assembly 100 in the method described hereinabove comprises configuring the coil assembly 100 to be sensitive to magnetic resonance signals in a plurality of orientations with respect to a main magnetic field of a magnetic resonance system 10. The method of detecting the magnetic resonance signals by the radio frequency coil assembly 100 further comprises configuring the coil assembly 100 to detect radio frequency signals emanating within the cube-shaped volume in one specific example of the technique. In another specific example, detecting the magnetic resonance signals by the radio frequency coil assembly 100 comprises configuring the coil assembly 100 to detect radio frequency signals emanating outside the cube-shaped volume.

The various embodiments and techniques of the invention described hereinabove have applications in dynamic joint imaging, endoscopic imaging, catheter tracking and imaging, stent imaging and other imaging applications which require the imaging coil to be at any arbitrary angle with respect to B0. The embodiments described hereinabove can also be used as devices such as a inductive coupled resonator coupled to external coils, where the device is miniaturized and passed through a human anatomy for example, a digestive tract. The techniques may also be employed outside the medical diagnostic imaging field, as in imaging of any desired subject. Still further, applications may be had outside the imaging field entirely, such as in any field in which RF signals are detected for processing. Such fields include, of course MR spectroscopy.

While only certain features of the invention have been illustrated and described herein, many modifications and changes will occur to those skilled in the art. It is therefore to be understood that the appended claims are intended to cover all such modifications and changes as fall within the true spirit of the invention.

What is claimed is:

1. A radio frequency coil assembly usable with an NMR or MRI systems comprising:
   a set of conductors configured for detecting magnetic resonance signals in each of three mutually orthogonal planes defining a cube-shaped volume, wherein a conductor of the set of conductors is placed on each edge of the cube-shaped volume; and
   a set of capacitors configured for resonating the set of conductors at a predetermined frequency, wherein at least one of the capacitors is coupled to each conductor of the set of conductors, wherein the RF coil assembly is invariant in its performance with respect to the angle and orientation of a main magnetic field of the NMR or MRI system over the cube-shaped volume.

2. The RF coil assembly of claim 1, wherein coaxial cables are coupled to at least three mutually orthogonal conductors from the set of conductors.

3. The RF coil assembly of claim 2, wherein the coaxial cables are grounded and wherein a common point where the mutually orthogonal conductors meet is at ground potential.

4. The RF coil assembly of claim 2, wherein the at least three mutually orthogonal conductors coupled to the coaxial cables comprise a plurality of capacitors of effective capacitance equal to capacitance in each of the other conductors of the RF coil assembly.

5. The RF coil assembly of claim 1, wherein the coil assembly is configured to be sensitive to magnetic resonance signals in a plurality of orientations with respect to a main magnetic field of a magnetic resonance system.

6. The RF coil assembly of claim 1, wherein when placed in service, two orthogonal components of current flow exist in the set of conductors at any given instant in time.

7. The RF coil assembly of claim 1, wherein the coil assembly is configured to detect radio frequency signals emanating within the cube-shaped volume.

8. The RF coil assembly of claim 1, wherein the coil assembly is configured to detect radio frequency signals emanating outside the cube-shaped volume.

9. A four element band pass birdcage coil usable with an NMR or MRI system comprising:
   two square end ring segments, each end ring segment comprising four sides of equal effective length; and
   four rungs of effective length equal to the effective length of each side of each end ring segment, and wherein the four rungs join in respective corners of the end ring segments, wherein the four element band pass birdcage coil is invariant in its performance with respect to the angle and orientation of a main magnetic field of the NMR or MRI system.

10. The birdcage coil of claim 9, further comprising capacitors coupled to each side of the square end ring segments and to each rung in order to provide substantially equal effective capacitance in the square end ring segments and rungs.

11. The birdcage coil of claim 9, wherein at least two coaxial cables are coupled to two respective sides of at least one of the two square end ring segments and at least one coaxial cable is coupled to at least one of the four rungs.

12. The birdcage coil of claim 11, wherein the respective sides of the square end ring segments and the at least one of the four rungs coupled to the coaxial cables comprise a plurality of capacitors of effective capacitance equal to capacitance in other sides of the square end ring segments and other rungs.

13. The birdcage coil of claim 9, wherein when placed in service, two orthogonal components of current flow exist at any given instant in time and wherein the current flow is through the square end ring segments and rungs.

14. The birdcage coil of claim 9, wherein the birdcage coil is configured in order to detect radio frequency signals emanating from within the birdcage coil itself.

15. The birdcage coil of claim 9, wherein the coil is configured to detect radio frequency signals emanating from outside the birdcage coil.

16. A magnetic resonance system usable with an NMR or MRI system comprising:
   a radio frequency coil assembly comprising:
      a set of conductors configured for detecting magnetic resonance signals in each of three orthogonal planes defining a cube-shaped volume, wherein a conductor is placed on each edge of the cube-shaped volume; and
      a set of capacitors configured for resonating the set of conductors at a predetermined frequency, wherein at least one of the capacitors is coupled to each conductor of the set of conductors, wherein the RF coil assembly is invariant in its performance with respect to the angle and orientation of a main magnetic field of the NMR or MRI system over the cube-shaped volume;
   at least three coaxial cables coupled to mutually orthogonal conductors of the set of conductors configured for receiving the magnetic resonance signals detected by the RF coil assembly in three orthogonal planes; and
   signal processing circuitry coupled to the coaxial cables in order to process the magnetic resonance signals.

17. The magnetic resonance system of claim 16, wherein the at least three mutually orthogonal conductors coupled to the coaxial cables comprise a plurality of capacitors of effective capacitance equal to capacitance in each of the other conductors of the RF coil assembly.

18. The magnetic resonance system of claim 16, wherein each of the coaxial cables are grounded and wherein a common point located at where the mutually orthogonal conductors meet is at ground potential.

19. The magnetic resonance system of claim 16, wherein the RF coil assembly is configured to be sensitive to magnetic resonance signals in a plurality of orientations with respect to a main magnetic field of the magnetic resonance system.

20. The magnetic resonance system of claim 16, wherein when placed in service, two orthogonal components of current flow exist in the set of conductors of the RF coil assembly, at any given instant in time.

21. The magnetic resonance system of claim 16, wherein the RF coil assembly is configured to detect radio frequency signals emanating from within the cube-shaped volume.

22. The system of claim 16, wherein the RF coil assembly is configured to detect radio frequency signals emanating from outside the cube-shaped volume.

23. A magnetic resonance system comprising:
    a four element bandpass birdcage coil comprising:
        two square end ring segments, each end ring segment comprising four sides of equal effective length;
        four rungs, of effective length equal to the effective length of each side of each end ring segment, and wherein the four rungs join in respective corners of the end ring segments, wherein the four element band pass birdcage coil is invariant in its performance with respect to the angle and orientation of a main magnetic field of the MR system; and
        capacitors coupled to each side of the square end ring segments and to each rung in order to provide substantially equal effective capacitance in the square end ring segments and rungs;
    at least three coaxial cables, wherein at least two of the coaxial cables are coupled to two respective sides of the two square end ring segments and at least one coaxial cable is coupled to at least one of the four rungs; and
    signal processing circuitry coupled to each the coaxial cables in order to process the magnetic resonance signals.

24. The MR system of claim 23, wherein the respective sides of the square end ring segments and the at least one of the four rungs that are coupled to the coaxial cables comprise a plurality of capacitors of effective capacitance equal to capacitance in other sides of the square end ring segments and other rungs.

25. The MR system of claim 23, wherein when the four element bandpass birdcage coil placed in service, two orthogonal components of current flow exist at any given instant in time in the birdcage coil and wherein the current flow is through the square ring segments and rungs.

26. The MR system of claim 23, wherein the birdcage coil is configured in order to detect radio frequency signals emanating from within the coil.

27. The MR system of claim 23, wherein the birdcage coil is configured in order to detect radio frequency signals emanating from outside the coil.

28. A method for generating magnetic resonance data in the presence of a gradient field system comprising:
    detecting magnetic resonance signals by a radio frequency coil assembly, the radio frequency coil assembly including a set of conductors configured for detecting the magnetic resonance signals in each of three mutually orthogonal planes defining a cube-shaped volume, wherein a conductor of the set of conductors is placed on each edge of the cube-shaped volume;
    receiving magnetic resonance signals through one or more coaxial cables coupled to each mutually orthogonal conductor of the set of conductors; and
    processing the magnetic resonance signals to in order to obtain magnetic resonance data;
    wherein the radio frequency coil assembly comprises capacitors configured for resonating the set of conductors at a predetermined frequency, wherein the capacitors are coupled to each conductor of the set of conductors such that the RF coil assembly is invariant in its performance with respect to the angle and orientation of a main magnetic field over the cube-shaped volume.

29. The method of claim 28, wherein detecting magnetic resonance signals by a radio frequency coil assembly comprises configuring the coil assembly to be sensitive to magnetic resonance signals in a plurality of orientations with respect to a main magnetic field of a magnetic resonance system.

30. The method of claim 28, wherein detecting the magnetic resonance signals by the radio frequency coil assembly comprises configuring the coil assembly in order to detect radio frequency signals emanating from within the cube-shaped volume.

31. The method of claim 28, wherein detecting the magnetic resonance signals by the radio frequency coil assembly comprises configuring the coil assembly in order to detect radio frequency signals emanating from outside the cube-shaped volume.

* * * * *